United States Patent [19]
Oberman

[11] Patent Number: 5,925,897
[45] Date of Patent: Jul. 20, 1999

[54] OPTOELECTRONIC SEMICONDUCTOR DIODES AND DEVICES COMPRISING SAME

[76] Inventor: David B. Oberman, P.O. Box 8910, Stanford, Calif. 94309

[21] Appl. No.: 08/800,865

[22] Filed: Feb. 14, 1997

[51] Int. Cl.⁶ .......................... H01L 27/14; H01L 27/15; H01L 33/00; H01L 31/036
[52] U.S. Cl. ................. 257/80; 257/75; 257/88; 257/89; 257/103; 257/99; 257/443; 257/448; 257/466; 257/76; 313/500
[58] Field of Search .................. 257/88, 89, 79–80, 257/103, 443, 448, 459, 466, 99, 618, 64, 75–76, 81; 438/34–36; 313/500

[56] References Cited

U.S. PATENT DOCUMENTS

| | | | |
|---|---|---|---|
| 4,113,531 | 9/1978 | Zanio et al. | 438/94 |
| 4,199,385 | 4/1980 | Hung et al. | 257/89 |
| 4,933,601 | 6/1990 | Sagawa et al. | 257/88 |
| 4,984,034 | 1/1991 | Yamazaki | 257/88 |
| 5,226,053 | 7/1993 | Cho et al. | 372/45 |
| 5,418,395 | 5/1995 | Nagata et al. | 257/103 |
| 5,453,405 | 9/1995 | Fan et al. | 438/34 |

OTHER PUBLICATIONS

B. L. Frescura, "Large High–Desity Monolithic XY–Addressable Arrays for Flat Panel LED Displays," IEEE Trans. Electron Devices, vol. ED–24, No. 7, Jul. 1997, pp. 891–897.

Nakamura, Shuji et al.; High–Power InGaN/GaN double–heterostructure violet light emitting diodes; Appl. Phys. Lett. 62(19) May 10, 1993; pp. 2390–2392.

*Primary Examiner*—John Guay
*Attorney, Agent, or Firm*—Lumen Intellectual Property Services

[57] ABSTRACT

An optoelectronic semiconductor diode is made from a layer of many small individual semiconductor particles containing doping junctions positioned between two contact surfaces mechanically supported by substrates. In the preferred embodiment, the particles are formed of a semiconductor, such as indium gallium nitride, as the active region. The particles are of a size on the order of 10 to 100 microns and are formed by reacting metallic gallium and indium with ammonia, or by a similar method. Electrical contacts are made to the particles by conductive films that have been deposited on the inner surfaces of the substrates. These contacts can be either reflective or transparent, depending upon the materials used. The particles each contain a p-n or similar junction, created either by diffusing in dopants or by selectively activating dopants that are already present. When a forward bias is applied to an LED, minority carriers spill over the junction and recombine with majority carriers to produce light. Powder LEDs according to the present invention can in principle be manufactured to operate at any wavelength within the entire visible spectrum. In addition to light-emitting diodes, the diode design may be adapted to form various types of other optoelectronic diodes such as photodetector and photovoltaic cells. Accordingly, diodes produced according to this design may be used for many applications such as flat panel displays, general purpose lighting, solar cells, and optical communication. They may be fabricated as single diodes or as arrays of diodes having the same or different optical frequency characteristics.

15 Claims, 18 Drawing Sheets

OPTOELECTRONIC SEMICONDUCTOR DIODES AND DEVICES COMPRISING SAME

FIELD OF THE INVENTION

This invention relates to an optoelectronic diode which utilizes as its active region a layer of individual single-crystal semiconductor particles. This invention also relates to individual light emitting diodes (LEDs) and LED arrays, both monochromatic and polychromatic, and to flat-panel displays and other devices comprising such diodes.

BACKGROUND ART

The description of the prior art is divided into three parts: LEDs in general, III–V nitride LEDs, and electroluminescent powder light emitters.

LIGHT-EMITTING DIODES

A light-emitting diode (LED) is an electro-optic device, comprising a junction between two differently doped regions in a compound semiconductor. Typically, this is a p-n junction, although p-i-n, m-i-n, and m-i-p junctions are occasionally used as well. When a forward bias is applied to the junction, majority charge carriers from each region (electrons in n-type material, holes in p-type material) spill over the junction into the other region, in which they are minority carriers. These minority carriers recombine with majority carriers in the region of the junction, releasing their energy in the form of photons of light. These photons are all of a wavelength corresponding to the semiconductor's energy gap.

Typically, LEDs are fabricated by growing a thin epitaxial layer of a compound semiconductor on a doped single-crystal semiconductor wafer, usually of the same material as the epitaxial film. This epitaxial layer has both n-type and p-type regions. The wafer is then diced into many small pieces, and electrical contacts are attached to the front and back sides of the pieces to form the individual LEDs. The light is emitted from the side. A typical thin-film LED is shown in FIG. 1. A piece of a semiconductor wafer 2 contains a film with a p-n junction 4, which emits light when forward-biased. Electrical contacts 6 are connected to the p and n regions of the wafer, and the entire LED is enclosed in a plastic package 8.

Monolithic arrays of LEDs are desirable for several applications, such as displays, printers, and photocopiers. These arrays are typically manufactured by fabricating a large number of LEDs on one wafer, using a technique such as proton implantation to electrically isolate them from one another. Arrays manufactured in this way are expensive, due to the high cost of compound semiconductor substrates, and limited to operating at one wavelength.

A primary factor reducing the external efficiency of many thin-film LEDs is the fact that the semiconductor substrate absorbs a significant amount of the light emitted by the junction. This is illustrated in FIGS. 2(*a*) and 2(*b*). FIG. 2(*a*) represents the operation of a thin-film LED. A significant portion of the light that is emitted by the p-n junction enters the semiconductor substrate 2, which absorbs it. Up to 85% of the emitted light is lost in this way. In contrast to the above prior art, an LED that has no semiconductor substrate to absorb the light, such as the powder LED described in the present invention, does not have this problem. The downward-emitted light which would ordinarily be absorbed by the substrate can instead be reflected upward by the reflective bottom contact. FIG. 2(*b*) shows a powder LED of the present invention in operation. This LED has no semiconductor substrate, and the light that is emitted downward is reflected back upward by the reflective bottom contact 4.

One prior art LED design (Nagata, U.S. Pat. No. 5,418,395) describes an LED fabricated from a polycrystalline semiconductor layer, rather than a single-crystal epitaxial layer. The individual LEDs are fabricated from single large grains within the polycrystalline layer. The layer is not grown epitaxially on a single-crystal semiconductor wafer, but is instead grown by a vapor-phase technique on a layer of glass, ceramic, or other inexpensive material. This design alleviates some of the limitations of single-crystal wafers, such as cost, size, and difficulty of processing. It thus provides an inexpensive way of creating monolithic arrays of LEDs. However, this design retains the limitations of vapor phase growth. For example, the choice of substrates is limited to those (e.g., glasses, ceramics, refractory metals) which can stand up to the high temperatures necessary to form semiconductor films. This limitation is particularly important in the case of nitride-based semiconductors, the growth temperatures of which are on the order of 1000° C. and above. As this design uses a vapor phase growth technique, only a limited number of precursors (typically metallorganic compounds, which are expensive and often hazardous) can be used. In addition, this design is only suitable for fabricating monochromatic LED arrays, and cannot be used to form monolithic arrays of LEDs of different colors.

NITRIDE LEDS

In recent years, LEDs based on the III–V nitride semiconductors (InN, GaN, AlN, and alloys of these three materials) have become commercially available. Devices made from these materials, and intermediate alloys, can be made to emit light anywhere from the red to the ultraviolet. Most commercial nitride LEDs are either blue or green. Blue and green LEDs manufactured from the nitride semiconductors are much brighter, longer-lived, and more efficient than those made from the competing materials: silicon carbide (blue) and gallium phosphide (green).

Nitride LEDs are fabricated from thin films that are typically grown by metallorganic chemical vapor deposition (MOCVD) on sapphire substrates. Single-crystal substrates of the nitrides do not currently exist, and are not likely to exist in the foreseeable future, due to the extremely high temperatures and pressures that would be necessary to grow large single crystals. Therefore, nitride films must be grown heteroepitaxially on other substrates. Sapphire is currently the most popular substrate, despite its large lattice mismatch to the nitride semiconductors. Other substrates, such as silicon carbide, have closer lattice matches, but are too expensive to be used in a economical LED fabrication process.

As sapphire is an electrical insulator, forming bottom contacts to LEDs grown on sapphire is impossible. Etching or removing the sapphire substrate is nearly impossible due to its extreme hardness (second only to diamond) and imperviousness to chemicals. In order to make an electrical contact to the lower layer of the device, one must first etch through the top layer. This step is very difficult due to GaN's high resistance to chemicals. The need to make both electrical contacts to the LED from the top adds a costly processing step, and, in addition, places a limit on the extent to which LEDs can be shrunk. As sapphire does not cleave easily, the wafer must be diced into individual LEDs using a diamond saw.

A schematic diagram of the current state-of-the-art nitride LED is shown in FIG. 3. The structure is processed from a multilayer film grown on a transparent, insulating, sapphire substrate 2. The active region is a thin layer of InGaN 8, which has been co-doped with both Si (donor) and Zn (acceptor). It sits between a layer of n-type GaN 4 and p-type GaN 6. Underlying the entire structure is a highly dislocated and defective buffer layer of GaN 10, which is produced by the very large lattice mismatch between GaN and sapphire. As the sapphire is non-conducting, both electrical contacts 12 are made from the top of the structure.

In order to operate at visible wavelengths, nitride LEDs must contain indium. Pure GaN has a bandgap of 3.4 eV, which corresponds to ultraviolet light. InN has a bandgap of 1.9 eV, which corresponds to red light. Small amounts of InN are thus alloyed with GaN to obtain InGaN with a bandgap in the blue or green. Sufficient incorporation of indium is very difficult at the growth temperatures necessary for MOCVD, as the indium-containing metallorganic precursors desorb at the high temperatures (>1000° C.) necessary to grow nitrides.

For example, the blue nitride LEDs currently on the market contain only about 15% InN in the active region; this is less than a third of the amount necessary to shrink the bandgap to the desired operating wavelength of 470 nm. Blue light is obtained by an optical transition between deep acceptors and shallow donors, rather than a direct band-to-band transition. These donor-acceptor transitions are not as efficient, in terms of light output per power input, as band-to-band transitions are. Nitride LEDs with a higher indium composition would thus be expected to be brighter than those currently on the market, with a lower power consumption.

Currently, nitride LEDs are limited in the available choice of dopants, particularly p-type. The currently available p-type dopants (Zn and Mg) produce very deep (150 meV) acceptor levels. The depth of these levels decreases both the efficiency of optical transitions and the maximum hole concentration in p-type material. Although other elements, such as carbon and beryllium, are predicted to produce shallower acceptor levels in the nitrides, suitable precursors are not available for the vapor-phase techniques that are currently used for growing nearly all nitride films. A method of doping nitride semiconductors using elemental precursors, rather than chemical compounds, would vastly increase the range of available dopants.

ELECTROLUMINESCENT POWDER LIGHT EMITTERS

Light-emitting electroluminescent (EL) powder devices have been available since the early 1950s. A typical EL powder device is shown in FIG. 4. A layer of a dielectric powder phosphor 2 is placed between two insulators 4. These insulators, in turn, are sandwiched between a reflective electrode 6 and a transparent electrode 8. The phosphor is typically a wide-bandgap material, such as ZnS, to which an impurity has been added. The impurities act as localized luminescent centers. The wavelength of the light emitted depends upon the impurity. These devices emit light when a high electric field, typically AC, is applied between the two electrodes. Electrons tunnel into the phosphor from electronic states at the insulator/phosphor interface, and are accelerated to ballistic energies by the high electric field in the phosphor. These electrons activate luminescent centers by impact excitation, and the excited luminescent centers emit photons. This mechanism differs from that of an LED in several ways. Light is emitted from the entire bulk of the phosphor, while in an LED light is only emitted from the region of the semiconductor junction. An EL device operates by the high-field excitation of the dielectric in a capacitor structure, while an LED operates by low-field injection of current across a junction in a diode structure. LEDs are much more efficient than EL devices; typical LED efficiencies are on the order of 10 lumens/watt, while EL phosphor efficiencies are typically less-than 1 lumen/watt.

SUMMARY OF THE INVENTION

It is therefore an object of the present invention to provide a simple and inexpensive optoelectronic semiconductor diode. It is another object of the invention to provide inexpensive LEDs, which can be used individually or integrated into monolithic arrays, either monochromatic or polychromatic.

One aspect of the invention comprises a light emitting diode (LED) which uses many individual small particles of a semiconductor, such as indium gallium nitride, as the active region. This design is based on the observation that surfaces, interfaces, and dislocations appear not to adversely affect the light-emitting properties of III–V nitrides. Nitride films with extremely high dislocation densities (~$10^{10}$ cm$^{-2}$) have been found to be suitable for the formation of bright LEDs, which demonstrate no noticeable degradation with use. Scanning luminescence studies of these films have shown that they consist of many strain-free single-crystal columnar domains which coalesce to form a single film. Luminescence occurs in the interiors of these domains, with the interfaces between the domains neither strongly contributing to the luminescence nor hampering it. The lack of lattice strain appears to be essential to the optoelectronic quality of nitrides, while dislocations and interfaces appear not to hinder it. The crystal particles used as the active region in the LEDs of the present invention are, in their luminescence properties, fundamentally the same as the single-crystal columns in a nitride film.

The particles are of a size on the order of 10 to 100 microns. These crystal particles are formed by reacting metallic gallium and indium with ammonia, or by a similar method. (Although the growth of large single crystals is beyond current technological capabilities, very small single crystals can be grown without great difficulty.) A single layer of the resulting powder is sandwiched between two substrates. In the context of this invention, the word "substrate" will be used to refer to a sheet of sturdy material, such as glass, which is used to provide mechanical support for the electrically active portion of the device. Electrical contacts are made to the particles of the powder by conductive films that have been deposited on the inner surfaces of the substrates. These contacts can be either reflective or transparent, depending upon the materials used. If electrical isolation between LEDs is not required, the bottom substrate can be a metal sheet, thus acting as a contact in and of itself. If the LEDs are to be electrically isolated from each other (e.g., in an array or display), then both the top and bottom substrates must be electrical insulators. The electrically conductive films making the contacts can be patterned, by standard lithographic techniques, to define individual devices.

The crystal particles each contain a p-n or similar junction, created either by diffusing in dopants or by selectively activating dopants that are already present. When a forward bias is applied to an LED, minority carriers spill over the junction and recombine with majority carriers to produce light.

Powder LEDs according to the present invention can in principle be manufactured to operate at any wavelength within the entire visible spectrum. Pure InN has a bandgap of 1.9 eV, so that it emits light at a wavelength of 6500 Å, which is red. Pure GaN has a bandgap of 3.4 eV, which means that it emits light at a wavelength of 3600 Å, which is in the ultraviolet. By combining these materials into alloys, it is possible to achieve material emitting light anywhere from red to ultraviolet. The composition of the powder can be controlled by reacting an alloy of Ga and In of the appropriate composition with ammonia.

Currently, prior art LEDs (nitride and otherwise) must be grown epitaxially on a substrate, generally by a vapor phase growth technique. This raises the cost of manufacturing them, due to the expensive starting materials required (e.g., single-crystal substrates and precursors). In addition, monolithic LED arrays made from epitaxial films are limited to a single wavelength and to the size of the wafer (typically ~3" diameter).

Because the active region of the LED of the present invention is formed without the substrate, the substrate can in principle be almost any transparent material. Substrates that are significantly less expensive, larger, and sturdier than the semiconductor wafers used by thin-film LEDs can be utilized. Glass is expected to be the most suitable for flat-panel displays, but other materials can be used as well. Clear plastic can be used to fabricate flexible arrays, and metal foils can be used as reflective substrates.

The crystal particles can be grown with a wider range of precursors than can the epitaxial films used in most LEDs. The standard vapor-phase techniques (MOCVD and VPE) that are most commonly used to grow semiconductor films for LEDs utilize chemical compounds as precursors—for example, gallium arsenide is typically grown using trimethylgallium as a gallium source and arsine as an arsenic source. These sources, besides being expensive, are often hazardous and require elaborate safety equipment to handle properly. The particles that are used in this design can be formed using elemental precursors—for example, pure gallium—that are relatively inexpensive and easy to handle. The use of elemental indium and gallium as precursors overcomes the difficulty of incorporating indium into InGaN.

Powder LEDs of different colors can easily and inexpensively be placed on the same substrate. For example, blue, green, and red LED's can be placed on one substrate by putting patches of InGaN powder of different compositions at different spots on the substrate. Such arrays can be used to manufacture monolithic full-color LED-based displays, as well as white light sources.

The method described in this patent is suitable for manufacturing not only LED arrays but large batches of individual LEDs, which can be used for standard LED applications. LEDs made in this way are expected to be much less expensive to manufacture than those made from epitaxial films, and should thus be highly competitive. This is particularly true of blue LEDs, which are currently very difficult to manufacture from epitaxial films.

DETAILED DESCRIPTION OF THE PREFERRED EMBODIMENT

Figure 1:
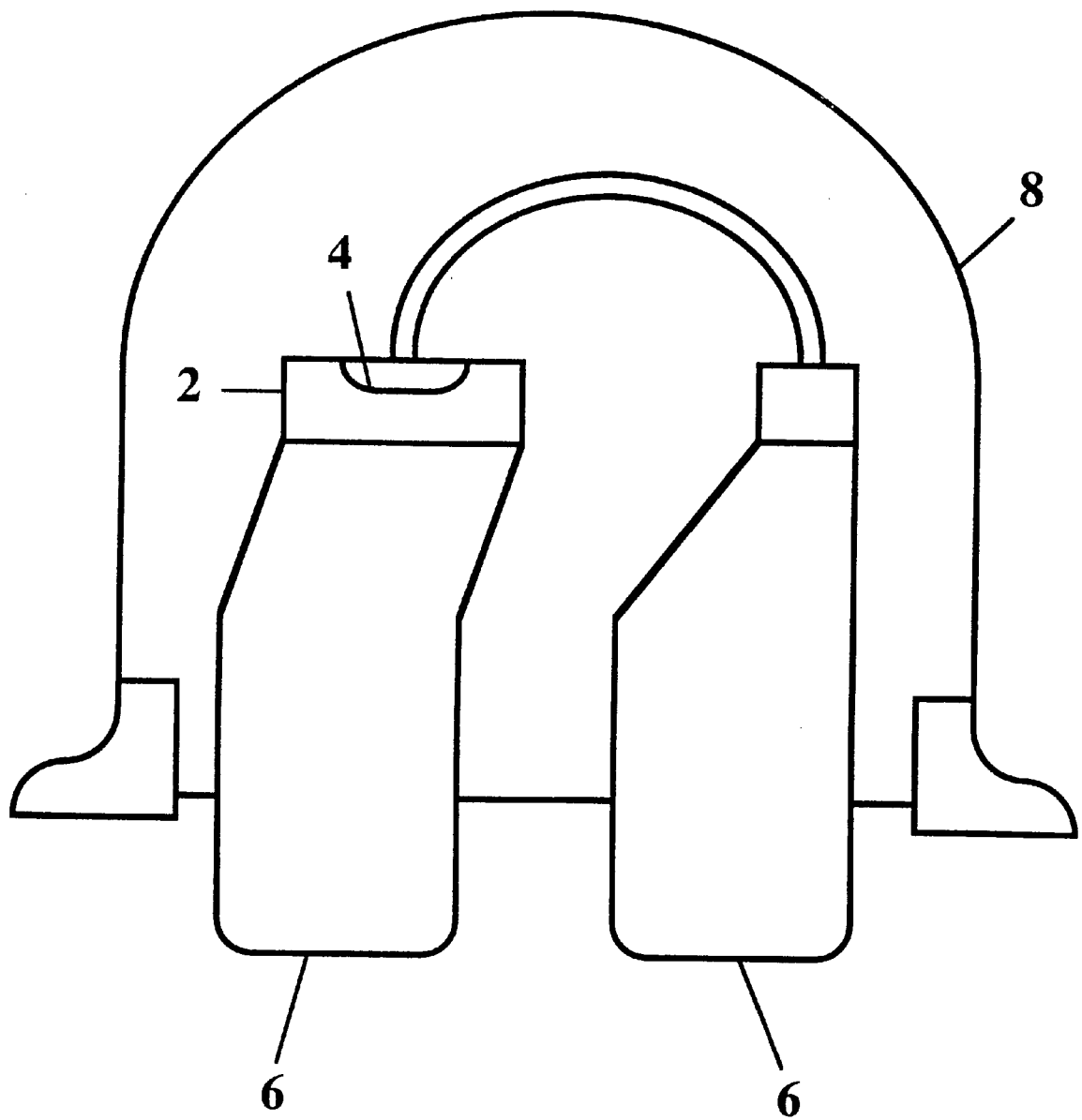
FIG. 1 is a cross-sectional schematic of an LED in accordance with the prior art.
Figure 2A:
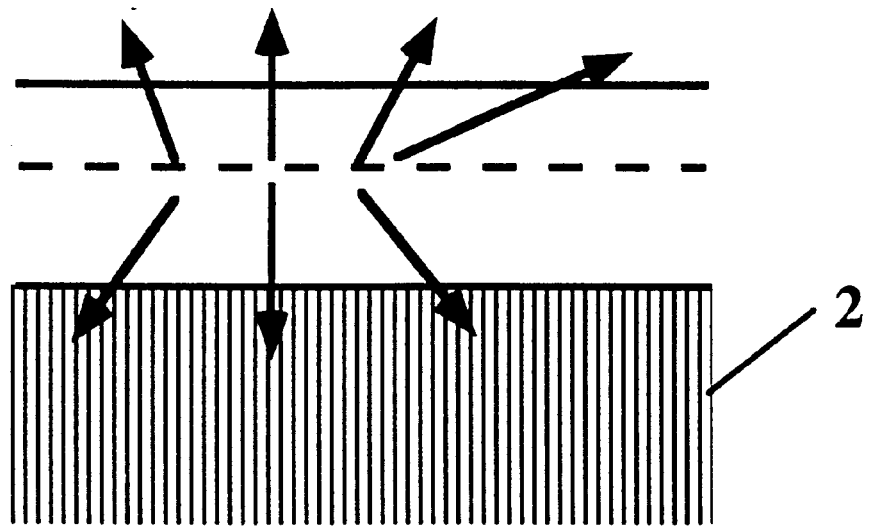
FIG. 2 is a comparison of the absorption and emission of light produced by a conventional LED (a) and a powder LED (b).
Figure 2B:
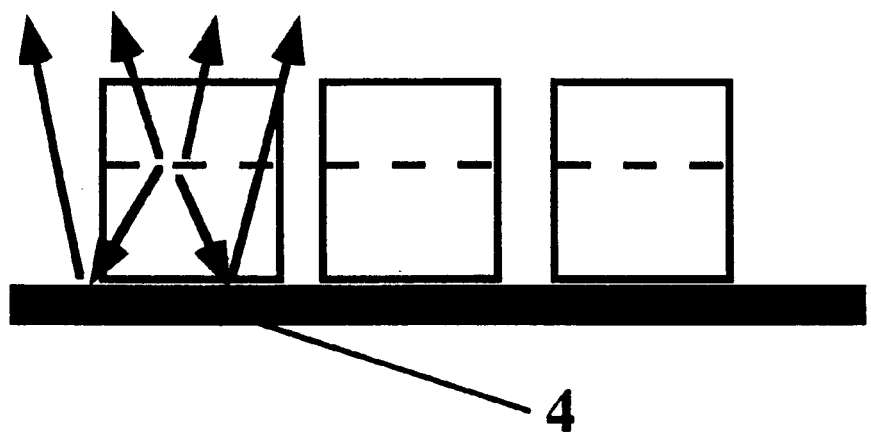
Figure 3:
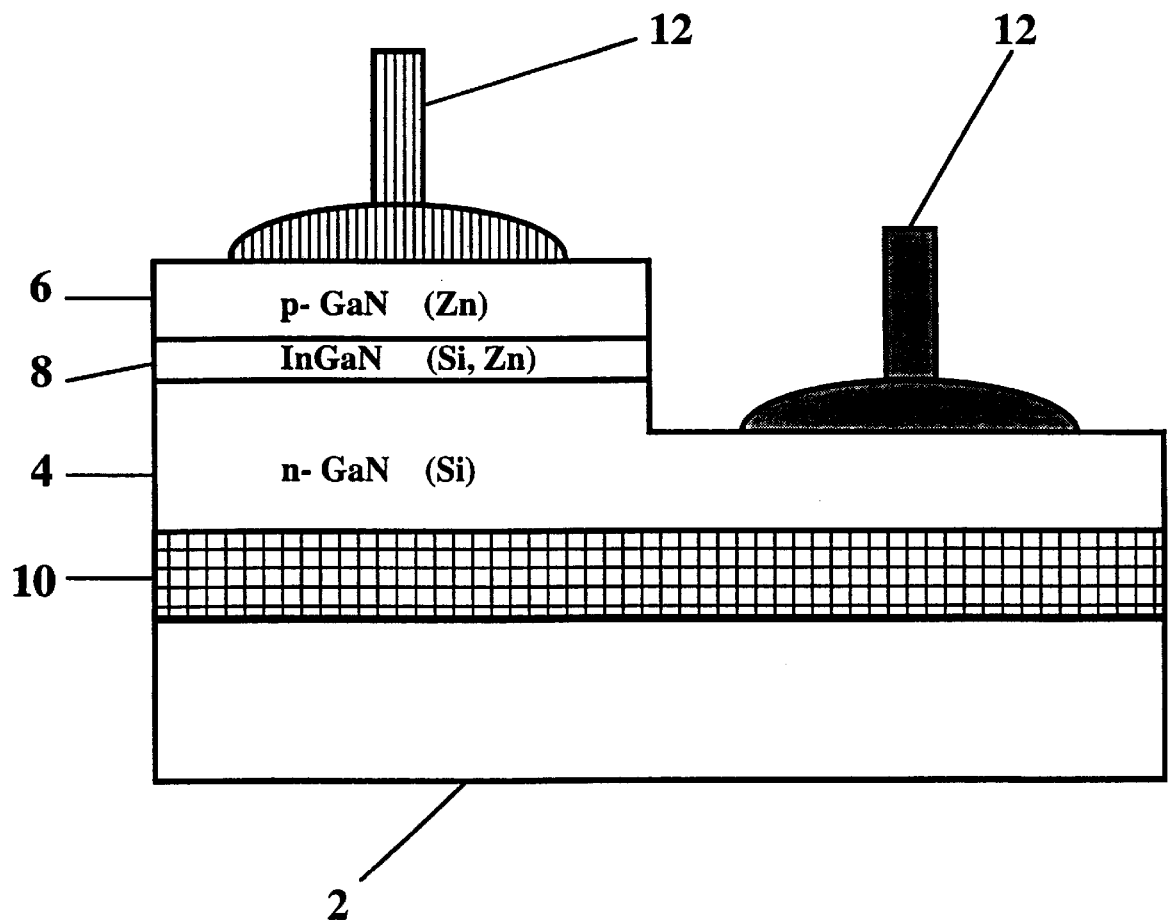
FIG. 3 is a cross-sectional schematic of a III–V nitride LED in accordance with the prior art.
Figure 4:
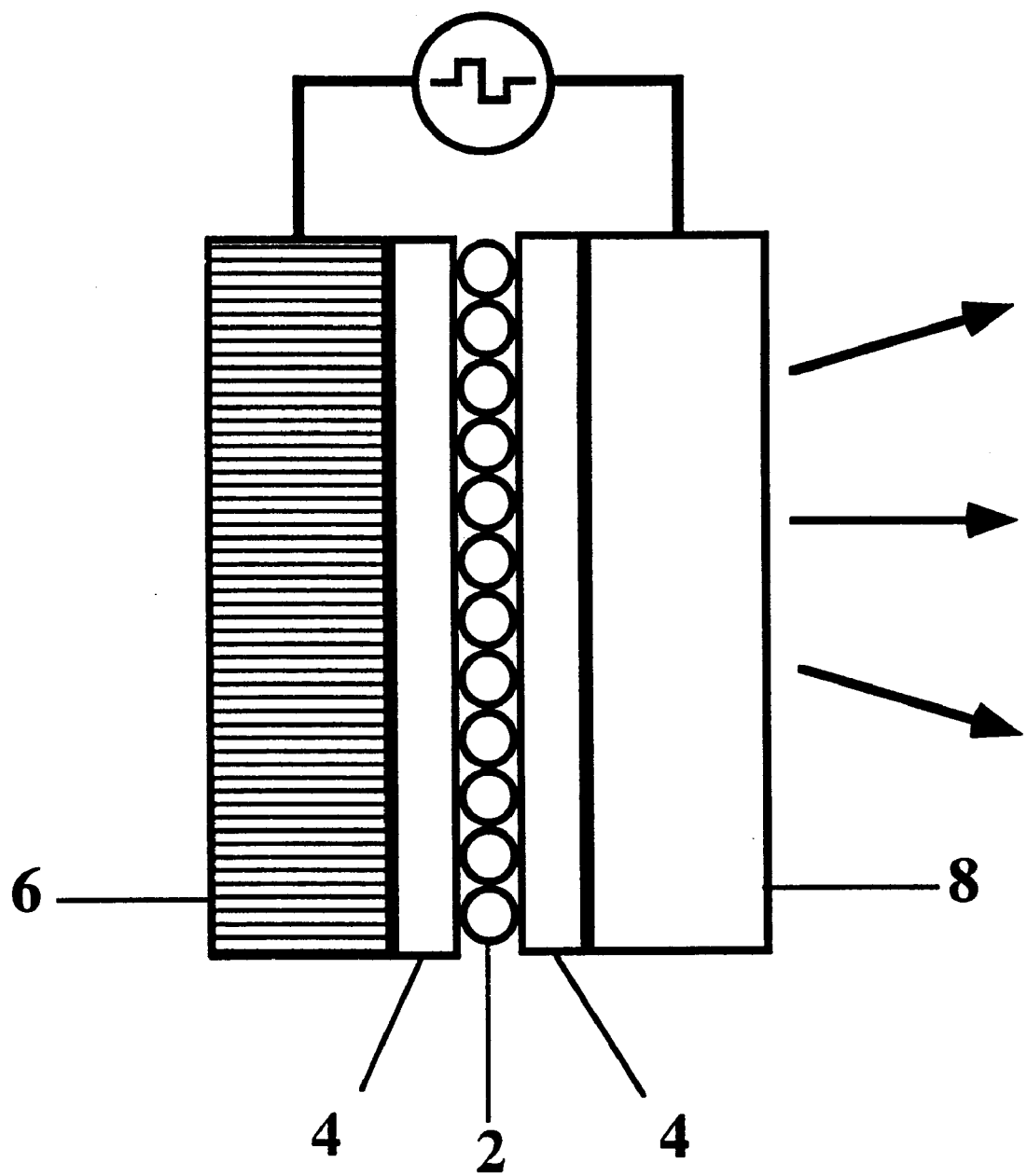
FIG. 4 is a cross-sectional schematic of an electroluminescent powder light emitting device in accordance with the prior art.
Figure 5:
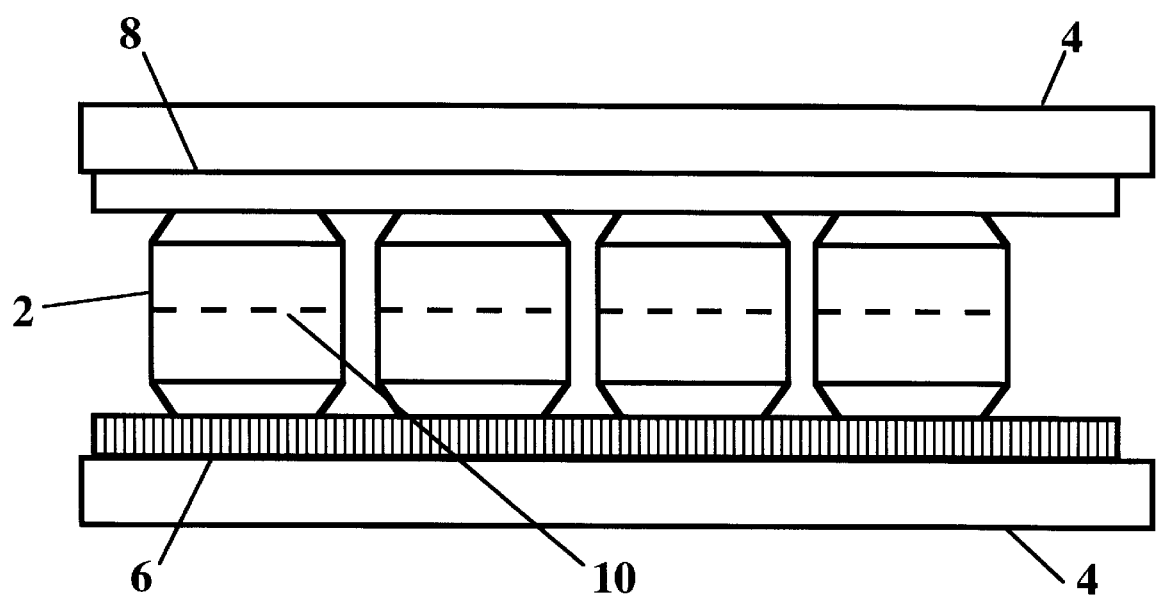
FIG. 5 is a cross-sectional schematic of a powder LED in accordance with the invention.

A schematic of a typical single LED according to the present invention is shown in FIG. 5. A layer of InGaN powder 2 is sandwiched between two glass plates 4. Light is generated when a forward bias is applied to p-n junctions 10 within the particles of the powder, and emitted from the top of the structure. Electrical contacts to the particles are made by patterned thin films on the inner surfaces of the glass plates. The bottom contact 6 is a thick reflective metal layer, and the top contact 8 is made from a transparent conductor, such as indium tin oxide (ITO), with a very thin layer (~100 Å) of metal to make an ohmic contact to the semiconductor. This layer is sufficiently thin that it does not absorb a significant amount of light.

Figure 6:
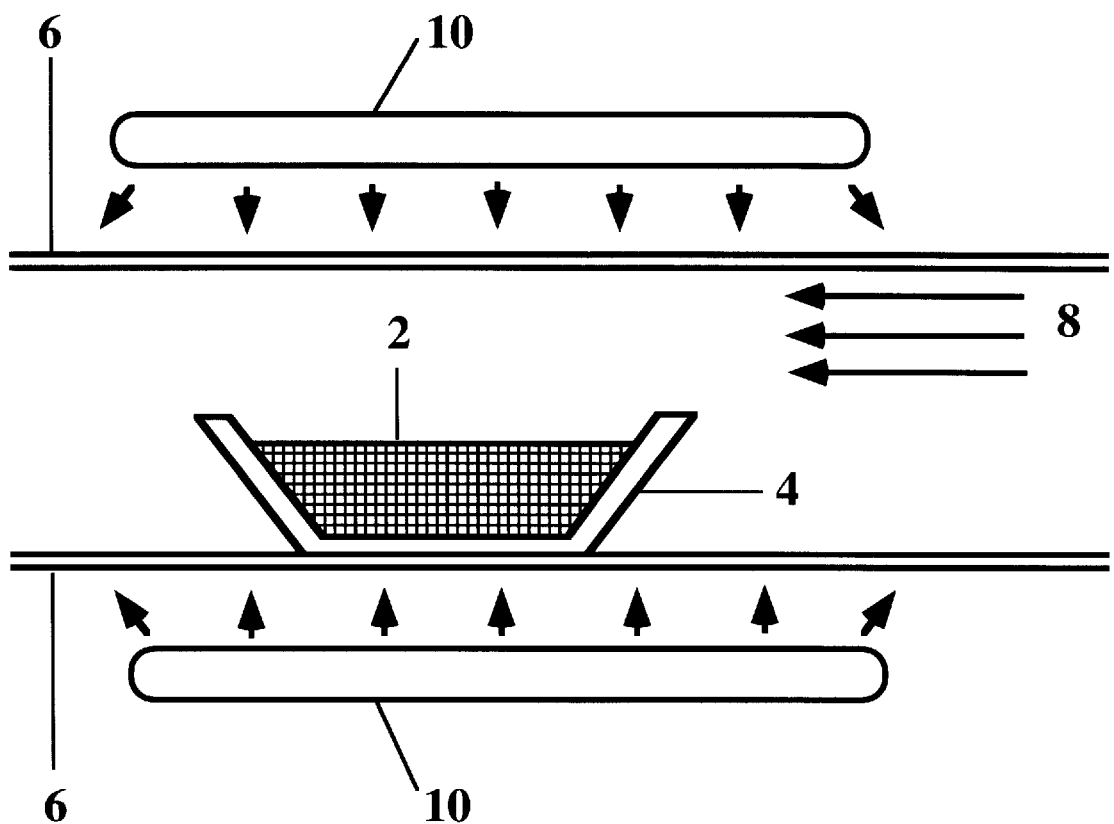
FIG. 6 shows the method used to manufacture InGaN crystal particles in the first embodiment of the invention.

The first step in manufacturing powder LEDs is to fabricate small individual crystals of InGaN. Typical alloy compositions of these crystal particles might be $In_{0.51}Ga_{0.49}N$ to obtain light at 470 nm (blue), $In_{0.68}Ga_{0.32}N$ to obtain light at 520 nm (green), and InN to obtain light at 650 nm (red). The process of forming the particles is illustrated in FIG. 6. A mixture of In and Ga metals 2, of the highest available purity (99.9999%), is placed in a ceramic crucible 4. This mixture contains In and Ga in the same proportions as the desired InGaN crystals. The crucible is placed inside a quartz tube 6, which is itself inside a furnace containing a radiative heat source 10. The tube is connected at one end to a gas manifold (not shown), and at the other end to a vacuum pump (not shown). Following the loading of the crucible, the tube is then flushed with ultra-high purity (99.999%) nitrogen gas and evacuated. This flushing and evacuating step is repeated several times, in order to remove any gases, such as oxygen and water vapor, which might contaminate the metals. As nitrogen is flowed through the furnace, the crucible and metals are heated to 200° C. in order to melt the metals. The molten metal is allowed to sit at this temperature for several minutes in order to allow thorough mixing of the gallium and indium. Ammonia gas 8 is then introduced into the chamber at a flow rate sufficient for an ammonia partial pressure of approximately 1 torr. The metal is then heated to a temperature of about 1000° C., at which point small single crystals of InGaN are nucleated. This reaction is allowed to proceed for several hours in order to form as many InGaN particles as possible. The resulting InGaN powder is cooled down, removed from the furnace, and dipped in acid to remove any residual indium and gallium. This InGaN powder will be n-type, due to native donors that naturally occur in undoped InGaN. For better control of the n-type carrier concentration, n-type dopants (such as silicon) can be diffused into the powder by a solid or vapor-phase diffusion process.

Figure 7:
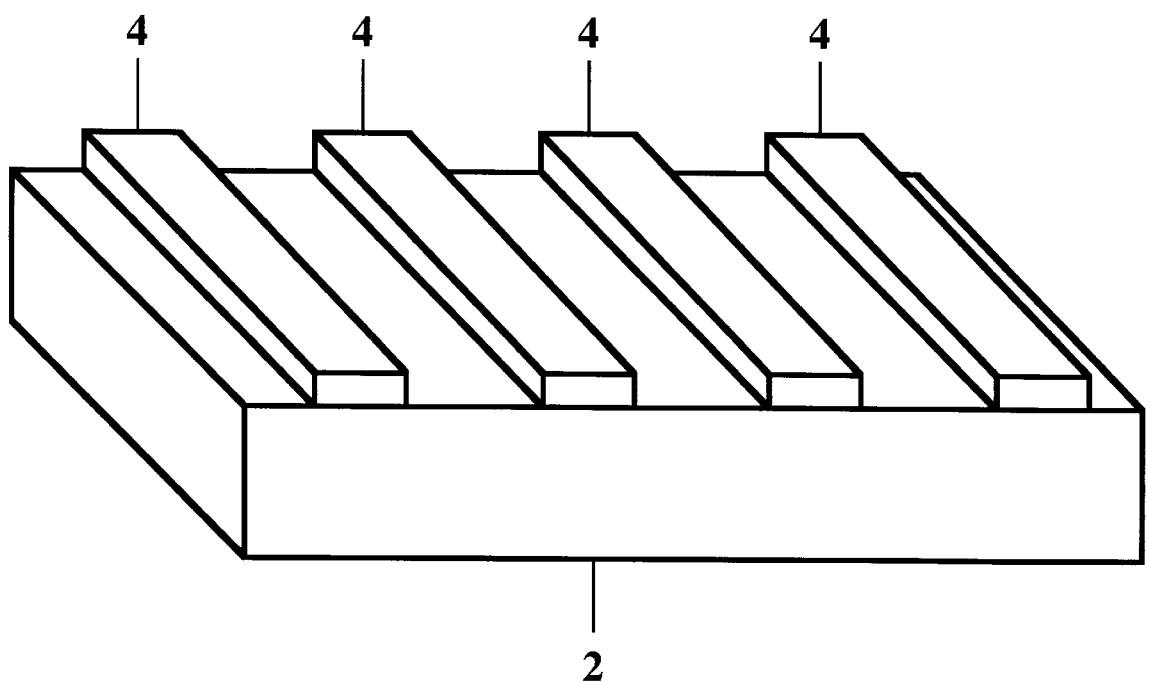
FIG. 7 shows a glass plate with reflective metal contact strips deposited, as a step in the fabrication process in accordance with the first embodiment.
Figure 8:
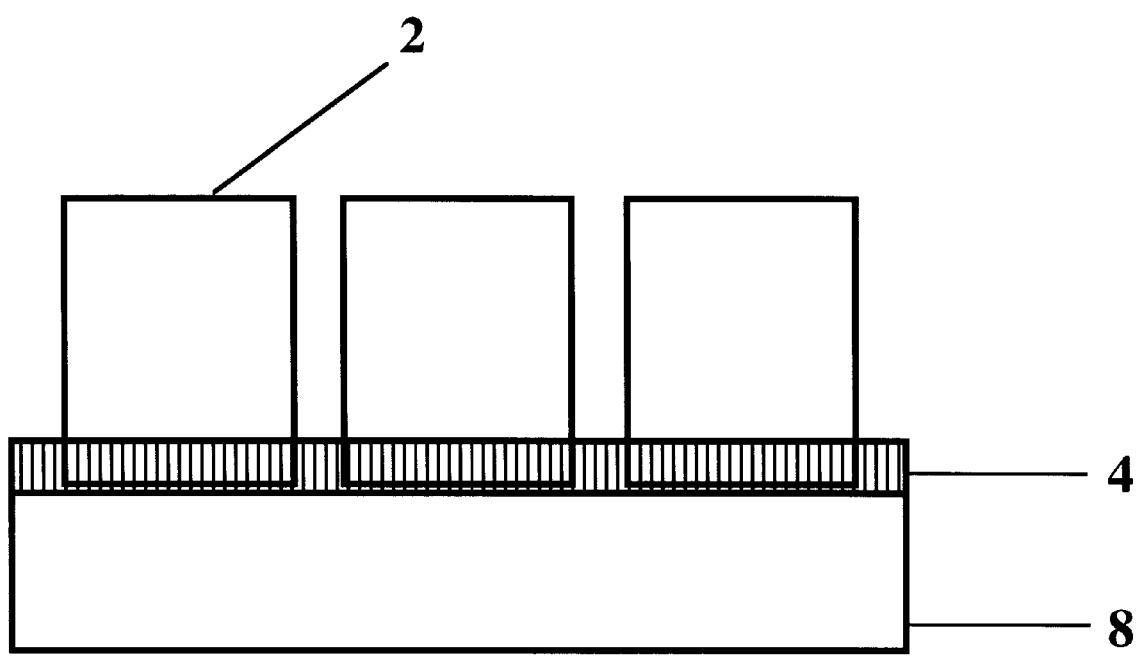
FIG. 8 shows a method of enhancing adhesion between InGaN particles and metal contacts in accordance with the first embodiment.

The bottom portion of the LEDs is depicted in FIG. 7. This is manufactured by coating one side of a flat glass plate 2 with a layer of an appropriate contact metal (Ti+Al for n-type InGaN, AuNi for p-type) to form an ohmic contact to the crystal particles. Suitable techniques for coating the substrate with the metal include sputtering and e-beam evaporation. The coating thickness will be of the order of one micron. If the ultimate goal is to slice the structure into individual LED's, the entire surface of the glass plate will be coated with the contact metal (or a thin sheet of metal can be substituted for the glass, obviating the need for coating it.). If the structure is to be made into one or more monolithic LED arrays, then the metal must be patterned into strips 4, using standard lithographic techniques. A method of enhancing the adhesion of the powder to the metal contacts is depicted in FIG. 8. A thin "adhesion layer" 4 is deposited on top of the metal contact layer 8. This layer consists of a metal, such as indium, with a relatively low (~200° C.) melting temperature. When the particles 2 are placed on the contacts, the entire structure is briefly heated to the melting point of the adhesion metal, while a slight amount of pressure is applied. The particles will become embedded in the adhesion metal while touching the contact metal. The adhesion metal will not make a good ohmic contact to the particles, and most of the current flow to the powder will be through the contact metal.

Figure 9:
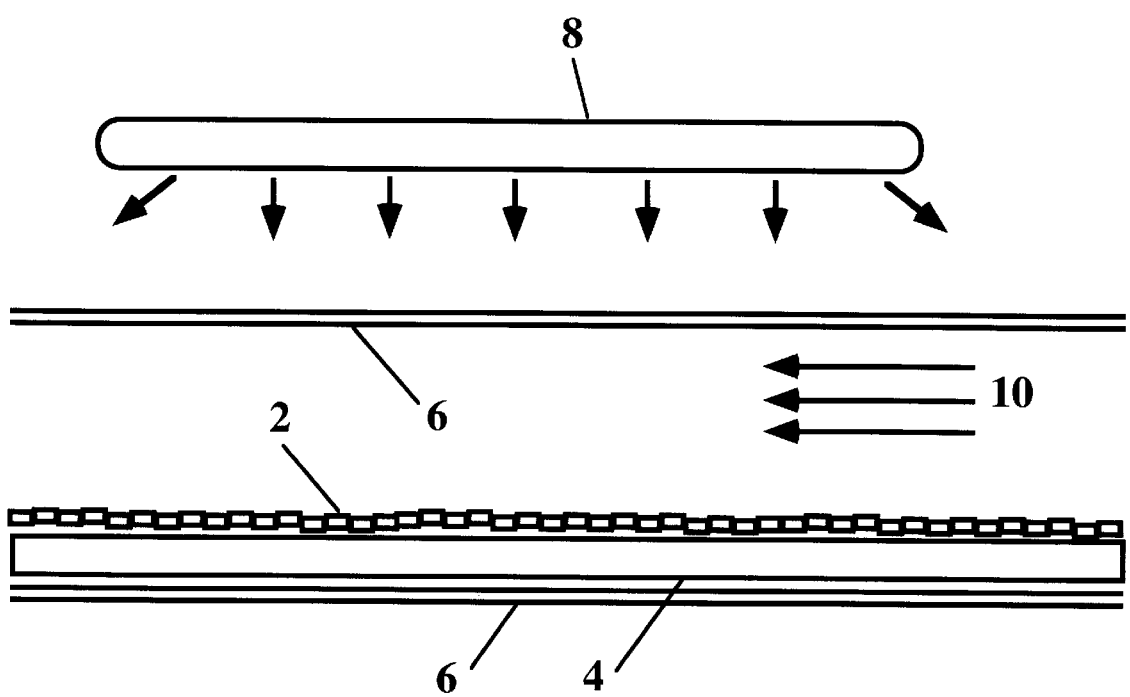
FIG. 9 shows the method used to create p-n junctions in accordance with the first embodiment.

At this point, the InGaN powder particles are entirely n-type. A p-type dopant, such as zinc or magnesium, must be diffused into the upper region of the powder to convert it to p-type and form a p-n junction. A method for accomplishing this is shown in FIG. 9. A single layer of the powder 2 is placed on a flat plate of quartz 4, by covering the side of the plate with powder and shaking off the excess. This plate is then placed in a quartz tube 6, which is placed in a furnace that is equipped with a radiative heater 8. Zinc vapor in a nitrogen carrier gas 10 is flowed over the powder, while the powder is heated to about 800° C. The vapor will diffuse down into the particles through a stagnant boundary layer. The reaction is allowed to proceed long enough that the vapor diffuses in to a depth of about one micron.

Figure 10:
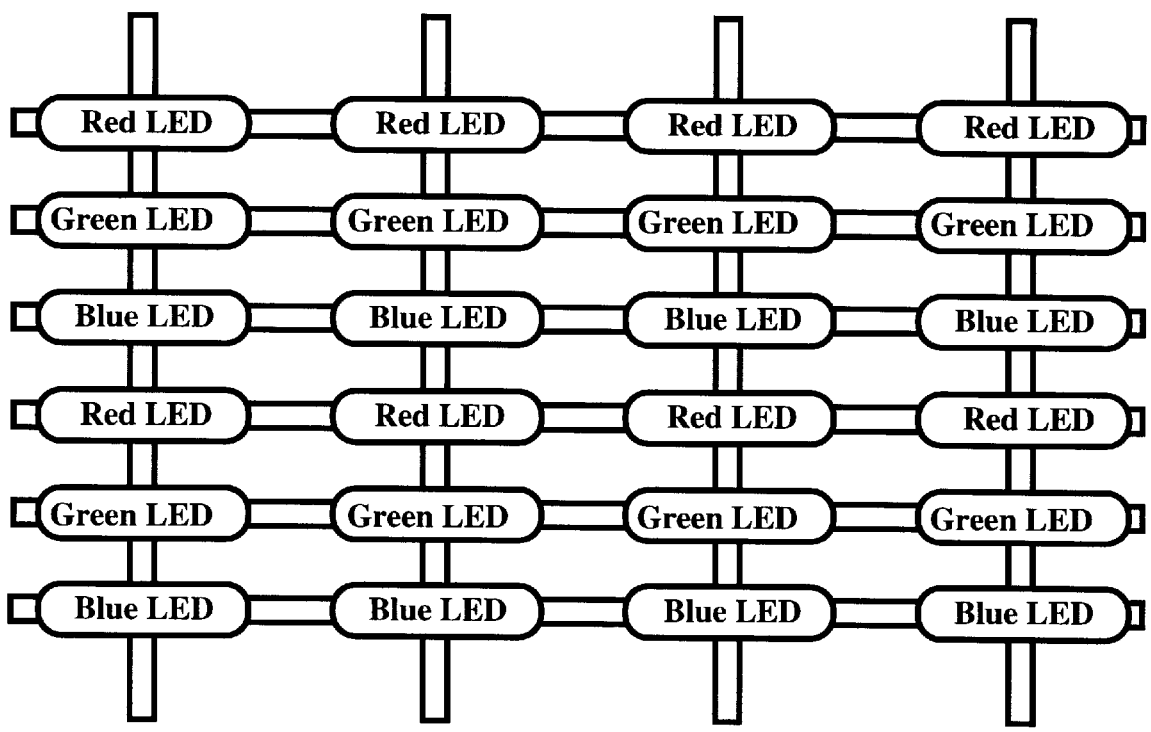
FIG. 10 is a schematic of a three-color array of individually addressable LEDs, seen from the top.
Figure 11:
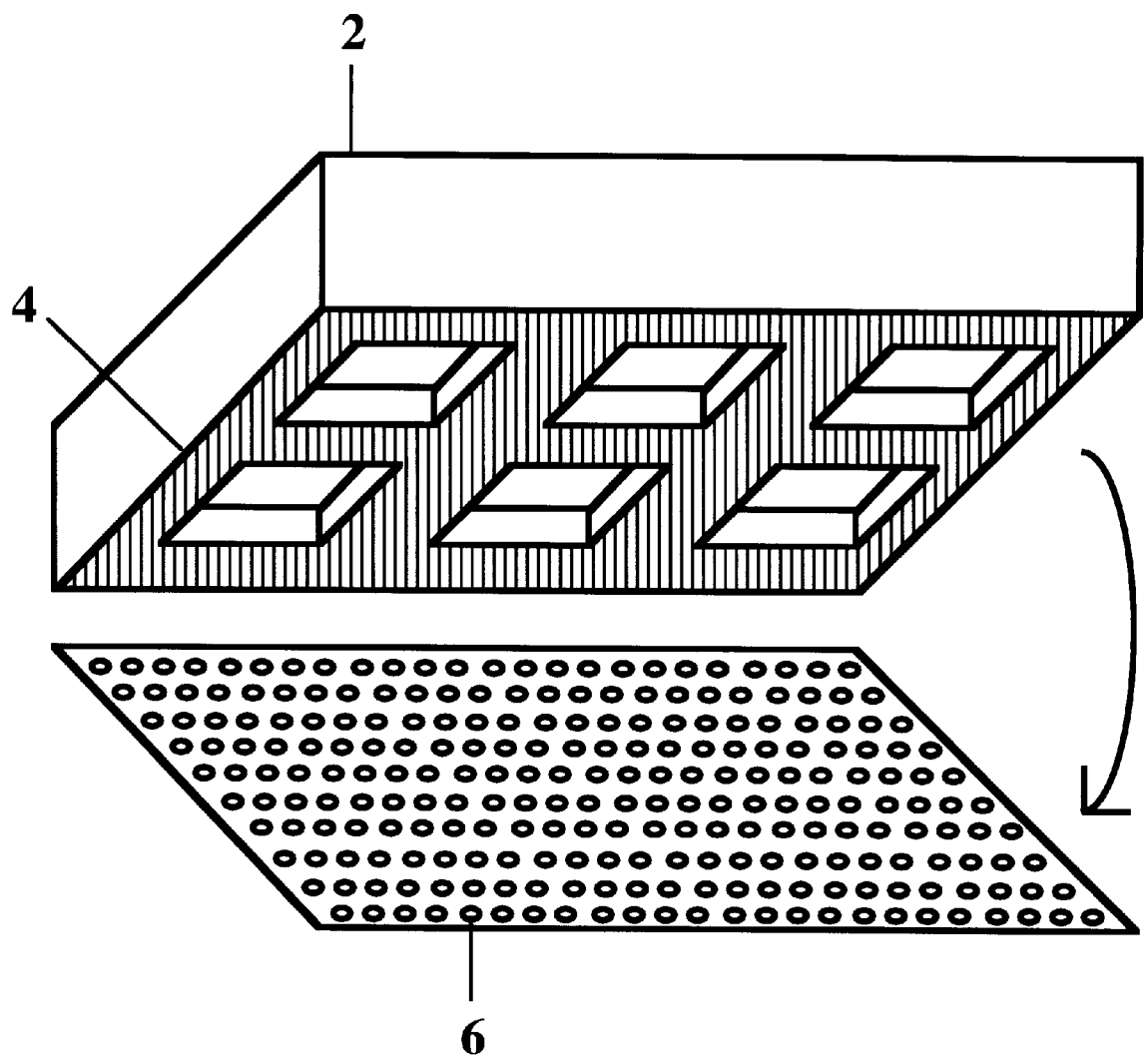
FIG. 11 shows a step in the fabrication process of powder LEDs in accordance with the first embodiment.
Figure 12:
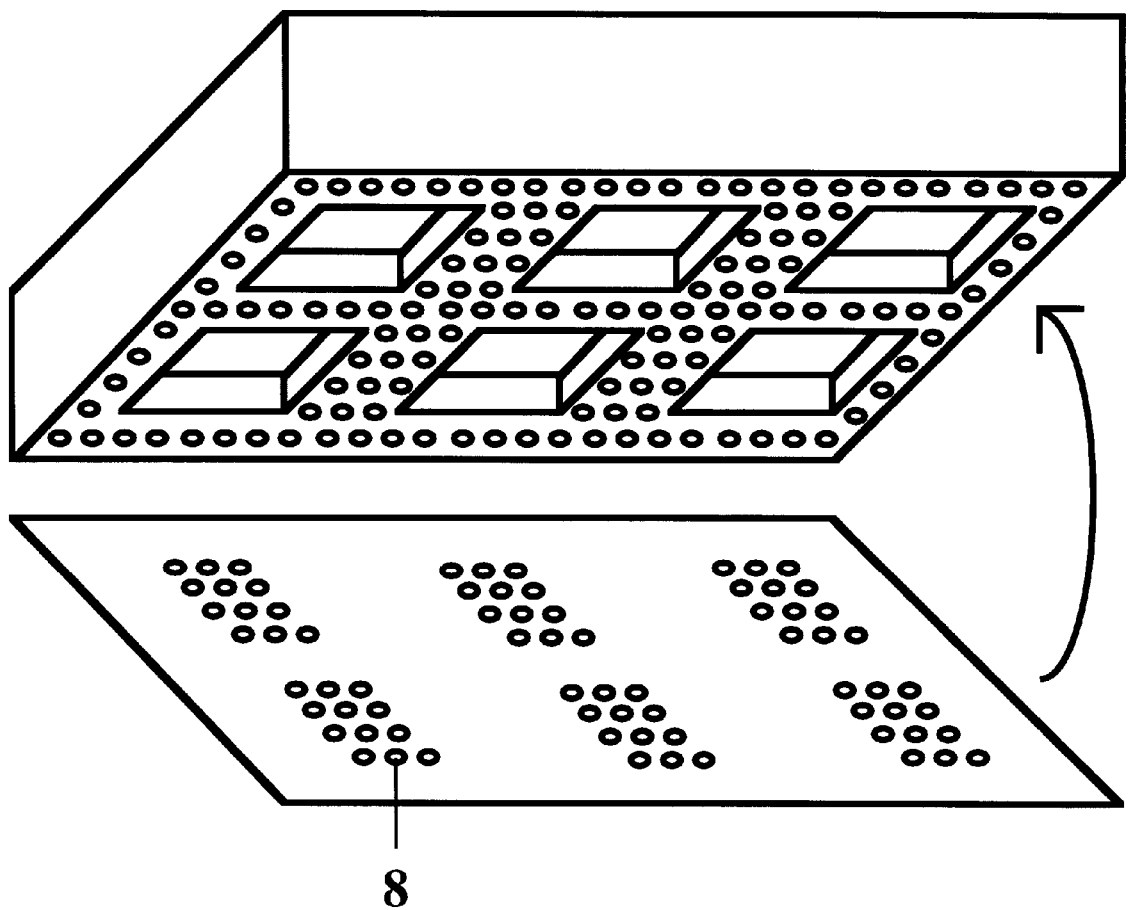
FIG. 12 shows a step in the fabrication process of powder LEDs in accordance with the first embodiment.
Figure 13:
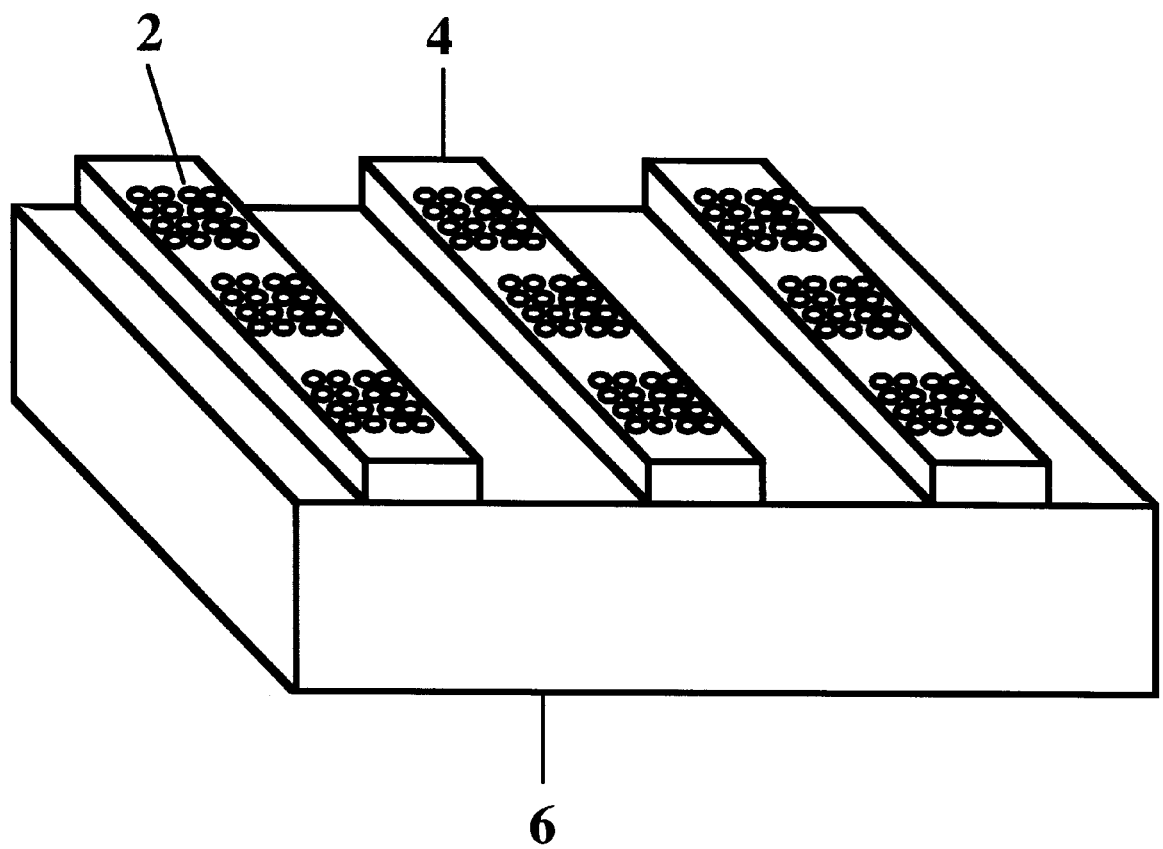
FIG. 13 shows a step in the fabrication process of powder LEDs in accordance with the first embodiment.

After powders of the desired composition or compositions have been prepared, the particles are placed on top of the metal contact regions. Patches of powder, of differing compositions, can be placed at different spots on the substrate in order to form LED arrays containing LEDs of different colors. Each LED constitutes an individual pixel in the array. For example, alternating lines of red, green, and blue powder can be used in order to make full-color displays or white light sources. A schematic of this type of array is shown in FIG. 10. A method of placing patches of different powders on the substrate is shown in FIGS. 11 and 12. In FIG. 11, a plate 2, made of rigid material such as glass or silicon, has rectangular pits of the same size and spacing as the individual LEDs of one color in the array. The raised area between the pits is coated with an adhesive material 4. This plate is lowered, adhesive side down, onto the powder 6. In FIG. 12, this plate is subsequently removed, leaving behind patches of powder 8, of the desired size and spacing. The glass substrate is now lowered, contact side down, onto the remaining patches of powder. As a slight pressure is applied, the structure is then thermally annealed in order to soften the metal (contact or adhesion), and cause the powder particles to become embedded. The result of this step is shown in FIG. 13. Each bottom contact strip 4 on the glass substrate 6 contains many individual patches of powder 2. These patches, when connected to the top contacts, will become individually addressable LEDs. The process is repeated three times in order to form LEDs of all three colors.

Figure 14:
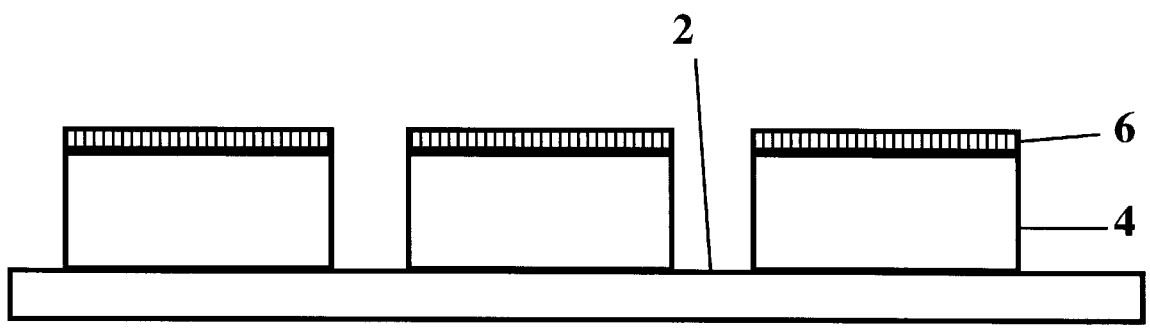
FIG. 14 shows a glass plate with transparent contact strips deposited, as a step in the fabrication process in accordance with the first embodiment.

The top layer of the structure is now prepared. This is shown in FIG. 14. An upper contact is fabricated by sputtering a thin layer 4 of a transparent conductor, such as indium tin oxide (ITO), on a thin glass plate 2. In order to make an ohmic contact to the powder, a very thin (~100 Å) layer 6 of the appropriate metal (AuNi for p-type InGaN) is deposited. If the structure is to be diced into individual LEDs, the metal can be deposited over the entire surface of the substrate. If a monolithic LED array is desired, the ITO and metal will be patterned into discrete strips, again using standard lithographic techniques.

Figure 15:
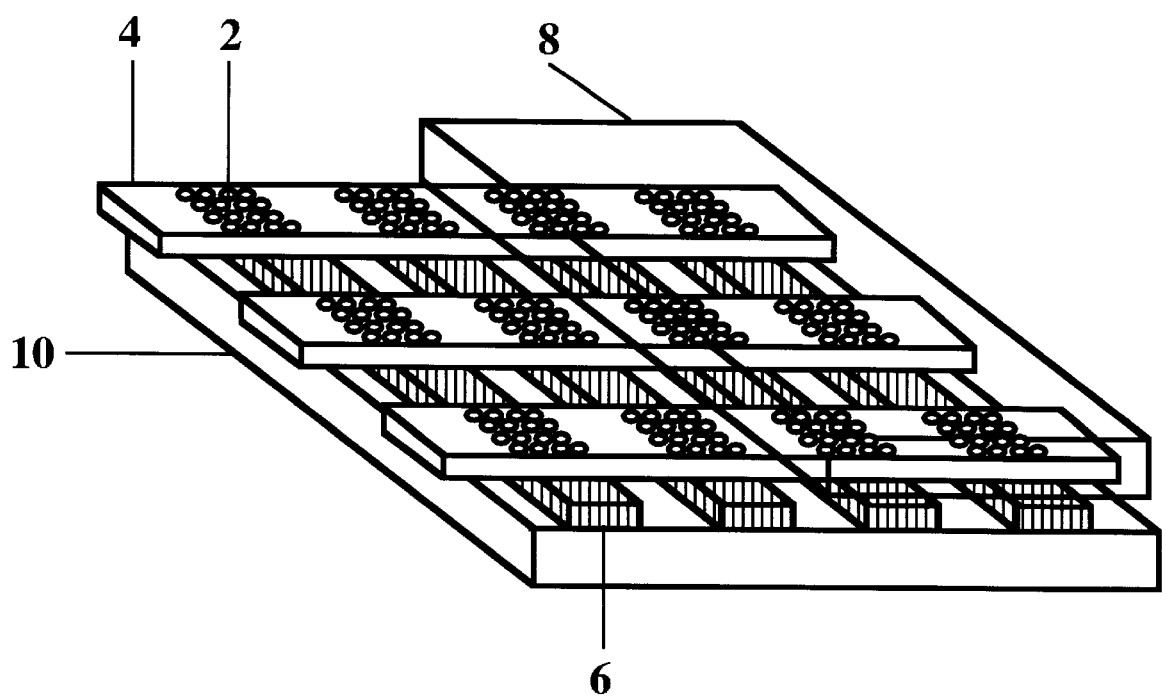
FIG. 15 is a cutaway view of a three-color array of individually addressable LEDs, in accordance with the invention.

In order to complete the structure, the top layer is placed on the powder, metal side down. The entire structure is again thermally annealed in order to enhance adhesion of the powder to the upper contacts. In order to make an LED array, the upper and lower layers should be aligned such that the contact strips on the upper layer run perpendicular to those on the lower layer. This is depicted in FIG. 15. Each LED in the array is made from a patch of powder 2, which is sandwiched between a transparent top contact 4, running in the "horizontal" direction, and a reflective bottom contact 6 running in the "vertical" direction. Structural support is provided by the top and bottom glass plates (8 and 10). The top and bottom contacts can be connected by ribbon cables or printed circuits to a display driver. Each LED in the array is uniquely connected to a single top contact strip and a single bottom contact strip, and can be individually turned on by applying a suitable voltage between those two strips. If single LEDs are desired instead of an array, the structure can be diced into pieces. These pieces can then be attached to contact wires and packaged in plastic.

VARIATIONS AND ALTERNATE EMBODIMENTS

Although glass is the most versatile substrate for these LEDs, other substrate materials can be used for different applications. For example, a metal foil could substitute for one or both glass layers. It would have the advantages of being reflective (for greater surface emission), easy to cut into individual devices, and a built-in bottom contact. As the metal is conductive, LEDs could not be electrically isolated from each other to form arrays, but individual LEDs could be readily fabricated. Large-area monochromatic LEDs—for such applications as traffic lights—could be made on metal substrates as well. Using two metal layers as substrates greatly facilitates attaching contact wires to the LED, but the LED can only be used in an edge-emission mode.

Sheets of certain plastics (e.g., polyimides) can be used instead of glass as substrates, in order to make LED arrays and displays that are lightweight and flexible. Such arrays might be useful as portable white light sources, displays in weight-critical applications (e.g., laptop computers, airplanes, head-mounted displays), and "virtual paper" that can be used in electronic "books," "newspapers," "magazines," "maps," "blueprints," etc. The plastic must be able to withstand temperatures up to about 200° C., so that the structures can be processed normally.

A transparent display can be fabricated by using transparent substrates (glass and/or plastic) and transparent contacts on both sides of the LED array. Such an array might be useful as a "heads-up" display that can be incorporated into a car windshield, an airplane cockpit, eyeglasses, a scuba mask, etc. These displays would enable the user to read information without having to move his or her eyes away from his or her surroundings. If the display is monochromatic, its "back" side (the side away from the user) can be coated with a quarter-wave mirror which reflects the LED wavelength but is transparent to other wavelengths. (To minimize scattering and ghost images, the mirror should be placed as close to the active region as possible, preferably on the inner surface of the "bottom" substrate.) This will enhance the visibility of the display to the user, by reflecting back light which would otherwise be lost, and will protect the privacy of his or her information by making it invisible from the "back side" of the display. As the mirror is transparent to other wavelengths, the user will still be able to see colors other than those of the LEDs clearly through the display.

Figure 16:
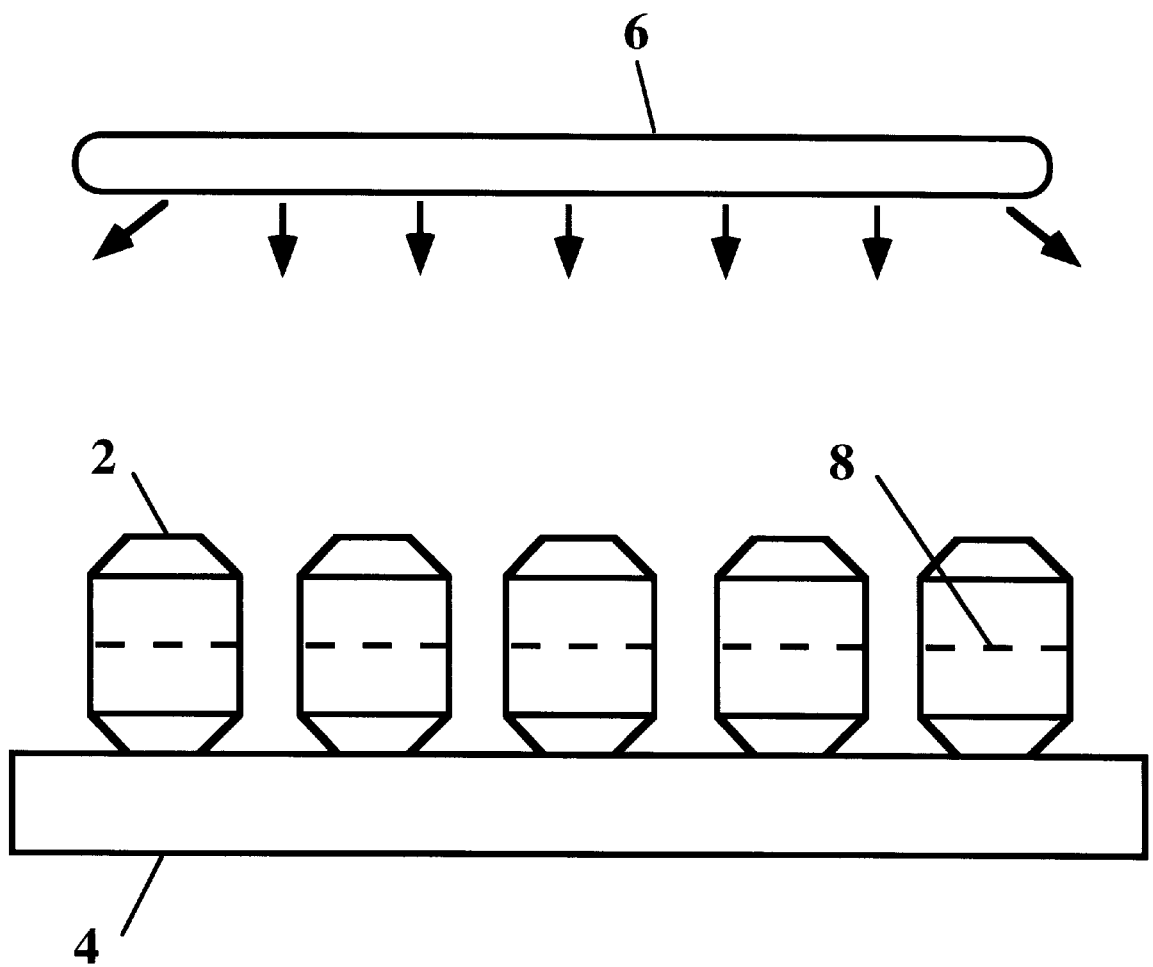
FIG. 16 shows an method of creating p-n junctions in InGaN particles in accordance with an alternate embodiment of the invention.

A method of forming p-n, i-n, and i-p junctions, which is different from, and possibly easier than, that described in the previous section, is now described. A p-type dopant is diffused into InGaN crystal particles in a manner similar to that shown in FIG. 9, but, instead of an elemental vapor, a chemical source, such as bis-cyclopentadienyl magnesium ($Cp_2Mg$) is used. The dopant is allowed to diffuse all the way into the particles. Alternatively, the dopant could be added to the particles by flowing a small amount of the dopant-containing precursor chemical into the quartz tube during the initial particle formation step depicted in FIG. 6. Although the p-type dopant pervades the entire particle, it is passivated due to the formation of dopant-hydrogen complexes. A method of forming junctions by selectively activating the dopant is shown in FIG. 16. A single layer of InGaN particle powder 2 is placed atop a heat sink 4, such as a thick sheet of thermally conductive metal.

This is placed in a non-reactive ambient (e.g., nitrogen, argon, vacuum), under a radiative heat source 6 that can be rapidly turned on and off, such as a flash lamp or pulsed laser. This heat source is very quickly pulsed, so as to heat only the top part of the powder to a temperature sufficient to activate the dopants (~1000° C.). Doping junctions are then created between the activated top parts of the particles and the inactivated bottom parts.

An advantage of the present invention is that a wider range of dopants can be used than is available for thin-film LEDs that are grown by vapor-phase epitaxial techniques. Other dopants might be found which are better than those described in the preferred embodiment. For example, carbon is predicted to act as a shallower acceptor than zinc or magnesium in nitride semiconductors, but so far has not been successfully utilized because the carbon-containing precursors commonly used in MOCVD tend to introduce carbon into the film in the form of electrically inactive carbon-hydrogen complexes. This difficulty could be obviated by diffusing elemental carbon into devices. For example, the semiconductor powder might be placed on a surface of elemental carbon (e.g., graphite or diamond), inside a chamber which would subsequently be evacuated. The carbon would be heated to a high temperature (between about 800° C. and 1000° C.), in order to induce diffusion of pure elemental carbon into the nitride powder from the bottom. Beryllium is another element which is predicted to act as a shallow acceptor in nitride semiconductors, but is not currently used due to the lack of a beryllium-containing chemical that is suitable for vapor phase growth. Elemental beryllium could be diffused into nitride powder in a manner similar to that described for carbon.

Although the III–V nitride semiconductor system is the primary material system discussed in this patent, other compound semiconductor systems— for example, the III–V arsenides, the II–VI sulfides, and the II–VI selenides—might be utilized as well to fabricate these devices. Individually, none of these semiconductor systems covers a wide enough range of bandgaps to span the entire visible spectrum, but powders of entirely different semiconductor materials can easily be used to make LEDs of the different colors. Powder LEDs made from semiconductors other than nitrides would not be expected to be very efficient, due to surface recombination effects (which do not appear to be present in nitrides), but might possibly prove bright enough for certain applications.

Figure 17:
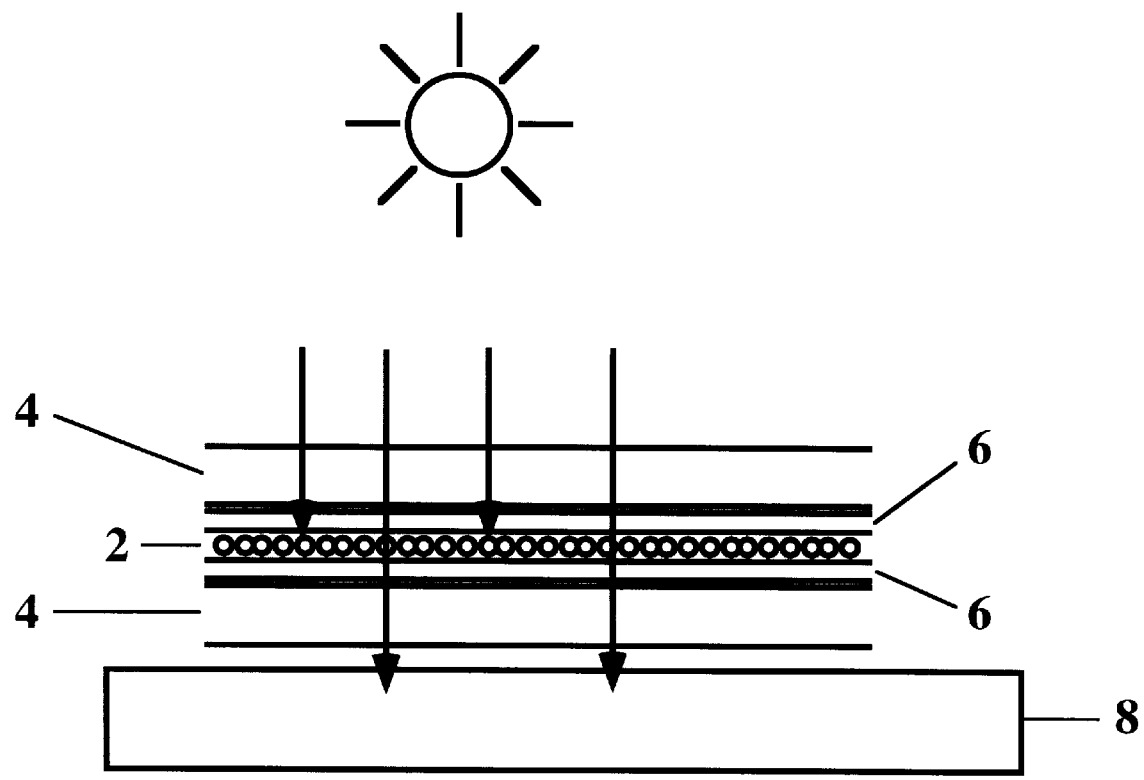
FIG. 17 shows an InN powder diode used as a solar cell in conjunction with an ordinary silicon solar cell, in accordance with an alternate embodiment of the invention.

InN powder diodes could be used as inexpensive solar cells. Solar cells are made from semiconductors with p-n junctions. When these junctions are illuminated with photons of energy equal to or greater than the semiconductor bandgap, electrons and holes are generated. These carriers diffuse across the junction and recombine, creating an electrical current. Most of the useful power in the solar spectrum consists of photons with energies between 1 and 2 eV, and semiconductors with bandgaps in that range are typically considered suitable for solar cells. InN has a bandgap of 1.9 eV, at the high end of this range. A solar cell fabricated from InN powder could be utilized either by itself or in tandem with a solar cell of another material (such as silicon, with a bandgap of 1.1 eV). Such a hybrid solar cell is depicted in FIG. 17. InN powder 2, containing p-n junctions, sits between two glass plates 4. Both electrical contacts 6 are transparent. Photons with an energy greater than or equal to 1.9 eV are absorbed by the InN layer; photons with energy between 1.1 and 1.9 eV are absorbed by the underlying silicon solar cell 8. In this way, a large portion of the solar spectrum can be utilized.

The powder diodes described in this patent can be used as photodetectors operating at the different visible wavelengths. Photodetectors, like solar cells, typically operate by photoelectric excitation of charge carriers, which are swept over a junction to generate an electrical current. Such photodetectors would be less expensive to fabricate than prior art photodetectors, which use epitaxial thin films. Arrays of photodetectors, either monochromatic or of different colors, can be fabricated in a fashion similar to the LED arrays described earlier.

Figure 18:
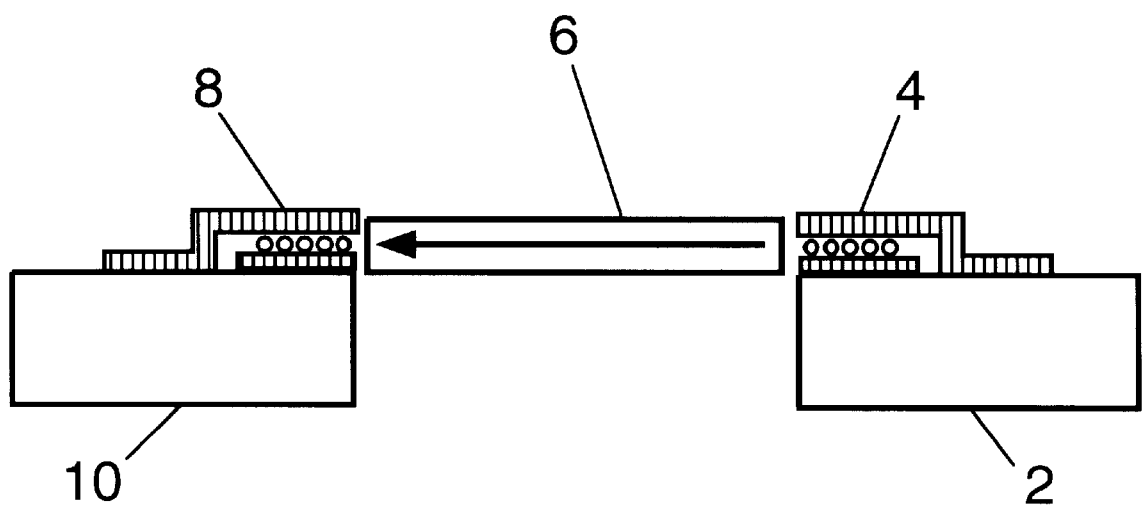
FIG. 18 shows powder LEDs and photodetectors used as a means of interconnecting silicon VLSI chips, in accordance with an alternate embodiment of the invention.

Powder-based LEDs and photodetectors can be monolithically integrated with silicon integrated circuits (ICs). In this case, the lower contacts can be deposited lithographically on the silicon IC, as part of the normal VLSI process. The powder particles and top contacts are placed on the chip by a method analogous to the fabrication process described in the preferred embodiment. As no epitaxial growth is required, this method of integrating optoelectronics with silicon chips is much simpler and less expensive than competing technologies, such as GaAs on Si. The integration of optoelectronic devices with silicon ICs has many potential applications, such as optical interconnections between individual chips. Such a configuration is shown in FIG. 18. A circuit on a silicon chip 2 turns on a powder LED 4 which has been fabricated on the chip. The LED emits light, which travels through a waveguide 6, striking a photodetector 8 that has been similarly fabricated on another chip 10. Such an optical interconnect provides essentially instantaneous communication between chips, eliminating clock asynchronicities and allowing for faster computation. In addition, it eliminates the capacitive "crosstalk" that currently plagues electronic interconnects.

Although the LEDs described in the previous section use p-n junctions, other doping junctions can be utilized as well. Suitable junctions include (but are not necessarily limited to) p-i-n junctions, m-i-n junctions, and m-i-p junctions. Schottky barriers are not suitable for LEDs, but can be used to make photodetectors and solar cells. A Schottky barrier diode can be fabricated by making one of the metal contacts to the powder with a metal that forms a rectifying Schottky contact, rather than an ohmic contact, to the semiconductor. When a semiconductor absorbs light, the absorption process creates an electron-hole pair. If the light is absorbed in the region of a Schottky barrier, the rectifying action of the barrier will cause the electron and hole to travel in opposite directions. The majority carrier (the electron, if the semiconductor is n-type; the hole, if it is p-type) will travel away from the barrier, while the minority carrier will travel into the metal. This motion of charge carriers gives rise to an electric current. The primary advantage of a Schottky barrier is that it acts as a rectifier, in a manner similar to a doping junction, and therefore eliminates the need to form a doping junction in the semiconductor. This reduces the number of processing steps necessary to fabricate the device, and thus makes them easier and less expensive to manufacture.

I claim:

1. A device comprising an optoelectronic semiconductor diode, wherein the diode comprises:
   a first conductive contact,
   a second conductive contact, and
   a layer of powder sandwiched between the first and second contacts;
   wherein the powder comprises doped semiconductor crystal particles.

2. The device of claim 1 wherein the diode further comprises a first plate and a second plate, wherein the first and second plates provide mechanical support for the first and second contacts, respectively.

3. The device of claim 2 wherein the plates are composed of a material chosen from the group consisting of a glass, a metal, and a plastic.

4. The device of claim 1 wherein each of the particles contains a semiconductor junction of a type chosen from the group consisting of p-n, p-i-n, m-i-n, m-i-p, i-n, and i-p.

5. The device of claim 1 wherein the diode emits light in response to an applied electric potential across the first and second contacts due to low-field injection of minority carriers over a doping junction.

6. The device of claim 1 wherein the diode generates an electric potential across the first and second contacts in response to the absorption of light by the particles.

7. The device of claim 1 wherein the diode has a first predetermined optical frequency response, and wherein the device comprises a second diode having a second predetermined optical frequency response distinct from the first predetermined optical frequency response.

8. The device of claim 1 wherein the device is a panel display comprising a plurality of the first conductive contacts, a plurality of the second conductive contacts oriented perpendicular to the first conductive contacts, and a plurality of doped semiconductor crystal particles sandwiched between the first and second contacts.

9. The device of claim 8 wherein the panel display is transparent to optical frequencies of light.

10. The device of claim 9 wherein the panel display comprises a quarter-wave stack mirror, wherein the mirror reflects a specific optical frequency.

11. The device of claim 1 wherein the device is a VLSI chip and the diode provides interchip optical communication.

12. The device of claim 1 wherein each of the particles forms a Schottky barrier with the first contact. wherein the diode generates an electrical potential between the first and second contacts in response to an absorption of light by the powder.

13. The device of claim 1 wherein the particles are composed a semiconductor chosen from the group consisting of a III–V nitride, a III–V arsenide, a II–VI sulfide, and a II–VI selenide.

14. The device of claim 1 wherein the particles are composed of a semiconductor doped with a material chosen from the group consisting of zinc, beryllium, magnesium, carbon, and silicon.

15. The device of claim 1 wherein the particles contain semiconductor junctions having a selectively activated dopant.

* * * * *